(12) United States Patent
Surana et al.

(10) Patent No.: US 8,815,629 B2
(45) Date of Patent: Aug. 26, 2014

(54) METHOD OF MANUFACTURING AN OPTICAL REFLECTOR WITH SEMICONDUCTOR NANOCRYSTALS

(75) Inventors: Kavita Surana, Grenoble (FR); Mathieu Baudrit, Chambery (FR); Pierre Mur, Crolles (FR); Philippe Thony, Entre Deux Guiers (FR)

(73) Assignee: Commissariat a l'energie atomique et aux energies alternatives, Paris (FR)

( * ) Notice: Subject to any disclaimer, the term of this patent is extended or adjusted under 35 U.S.C. 154(b) by 0 days.

(21) Appl. No.: 13/572,121

(22) Filed: Aug. 10, 2012

(65) Prior Publication Data

US 2013/0052772 A1 Feb. 28, 2013

(30) Foreign Application Priority Data

Aug. 24, 2011 (FR) ...................................... 11 57505

(51) Int. Cl.
*H01L 21/00* (2006.01)
*H01L 33/00* (2010.01)
*H01L 33/46* (2010.01)
*H01L 33/10* (2010.01)

(52) U.S. Cl.
CPC ................ *H01L 33/46* (2013.01); *H01L 33/10* (2013.01)
USPC ................... 438/69; 438/29; 438/72; 438/25; 438/33; 257/98; 257/89; 257/E31.11; 257/E31.127; 257/97; 313/501; 313/110; 313/113; 313/114; 313/116

(58) Field of Classification Search
CPC ......... H01L 33/10; H01L 33/46; H01L 33/20; H01L 33/44; H01L 33/58; H01L 33/60; H01L 31/18
USPC ........ 438/69, 72, 25, 29, 33; 257/89, 100, 88, 257/93, 95, 97, 98, 99, E31.11, E31.127; 313/501, 110, 113, 114, 116
See application file for complete search history.

(56) References Cited

U.S. PATENT DOCUMENTS

2002/0163003 A1    11/2002  Dal Negro et al.
2004/0106285 A1*   6/2004   Zacharias ...................... 438/689
(Continued)

FOREIGN PATENT DOCUMENTS

EP    2 105 968 A1     9/2009
WO    WO 2005/064394 A1    7/2005
(Continued)

OTHER PUBLICATIONS

French Preliminary Search Report Issued Mar. 26, 2012 in Patent Application No. 1157505 (with English translation of Categories of Cited Documents).

(Continued)

*Primary Examiner* — Julio J Maldonado
*Assistant Examiner* — Moazzam Hossain
(74) *Attorney, Agent, or Firm* — Oblon, Spivak, McClelland, Maier & Neustadt, L.L.P.

(57) ABSTRACT

A method of manufacturing an optical reflector including an alternating stack of at least one first layer of complex refraction index $n_1$ and at least one second layer of complex refraction index $n_2$, in which the first layer includes semiconductor nanocrystals, including the following steps: calculation of the total number of layers of the stack, of the thicknesses of each of the layers and of the values of complex refraction indices $n_1$ and $n_2$ on the basis of the characteristics of a desired spectral reflectivity window of the optical reflector, including the use of an optical transfer matrices calculation method; calculation of deposition and annealing parameters of the layers on the basis of the total number of layers and of the values of previously calculated complex refraction indices $n_1$ and $n_2$; deposition and annealing of the layers in accordance with the previously calculated parameters.

9 Claims, 3 Drawing Sheets

(56) References Cited

U.S. PATENT DOCUMENTS

| | | | |
|---|---|---|---|
| 2006/0169971 A1 | 8/2006 | Cho et al. | |
| 2007/0056627 A1 | 3/2007 | Yang et al. | |
| 2009/0251759 A1 | 10/2009 | Domash et al. | |
| 2012/0240987 A1* | 9/2012 | King et al. | 136/255 |
| 2012/0276815 A1* | 11/2012 | David et al. | 451/5 |

FOREIGN PATENT DOCUMENTS

| | | |
|---|---|---|
| WO | WO 2005/106966 A1 | 11/2005 |
| WO | WO 2007/143227 A2 | 12/2007 |
| WO | WO 2007/143227 A3 | 12/2007 |

OTHER PUBLICATIONS

C.L. Mitsas et al., "Generalized matrix method for analysis of coherent and incoherent reflectance and transmittance of multilayer structures with rough surfaces, interfaces, and finite substrates", Applied Optics, XP000498526, vol. 34, No. 10, Apr. 1, 1995, pp. 1678-1683.

I. Kovacević et al., "Silicon nanoparticles formation in annealed SiO/SiO$_2$ multilayers", Physica E, XP022040484, vol. 38, 2007, pp. 50-53.

S.E. Yancey et al., "The influence of void space on antireflection coatings of silica nanoparticle self-assembled films", Journal of Applied Physics, XPO012083759, vol. 99. 2006, pp. 034313-1-034313-10.

* cited by examiner

METHOD OF MANUFACTURING AN OPTICAL REFLECTOR WITH SEMICONDUCTOR NANOCRYSTALS

TECHNICAL FIELD

The invention concerns a method of manufacturing an optical reflector, for example of the distributed Bragg reflector type, also called a Bragg network or a Bragg mirror, notably including semiconductor nanocrystals modifying the optical indices, i.e. the complex refraction index, of one or more layers of materials of the optical reflector.

Such an optical reflector is advantageously used in the field of semiconductor devices, such as for example lasers, LEDs (Light-Emitting Diodes) and other optoelectronic applications. Such an optical reflector is also advantageously used in the photovoltaic field to form, for example, an anti-reflection structure intended to be positioned in the front face of a photovoltaic cell, or again a reflective structure intended to be positioned in the rear face of the photovoltaic cell.

STATE OF THE PRIOR ART

A distributed Bragg reflector (RBD), or Bragg network, is an optical reflector including a stack of materials forming alternating layers of materials of different complex refraction indices. When the reflector receives light, interferences occur within the reflector, where these interferences are dependent on the difference between the complex refraction indices of the materials of the layers of the reflector, on the number and on the thicknesses of these layers, and also on the optical characteristics of the materials surrounding the stack.

An RBD is defined by its reflectivity as a function of the received wavelength. This reflectivity is notably characterised by a spectral reflectivity window, or photon cutoff band, i.e. a range of wavelengths for which the RBD has maximum reflectivity compared to the other wavelengths.

RBDs are generally manufactured from III-V type semiconductor materials, or materials combining, for example, $SiO_2$ or $Si_3N4$ with amorphous or crystalline silicon, due to their difference of complex refraction indices. Documents WO 2005/064394 A1 and US 2002/0163003 A1 describe, for example, such RBDs.

However, one disadvantage of these RBDs is that they are costly to manufacture. In addition, the spectral reflectivity windows of these RBDs are difficult to adjust, since in order to change the complex refraction indices of the layers it may be necessary to change the materials of the layers, since each material has a determined refraction index, which is of constant value in the case of stoichiometric materials.

DESCRIPTION OF THE INVENTION

Thus there is a need to propose a new method of manufacturing an optical reflector forming, for example, a distributed Bragg reflector, enabling the spectral reflectivity window of the manufactured reflector to be adjusted easily, without increasing the costs relating to its manufacture.

To accomplish this, one embodiment of the present invention proposes a method of manufacturing an optical reflector including at least one alternating stack of at least one first layer of complex refraction index $n_1$ and at least one second layer of complex refraction index $n_2$ which is different from complex refraction index $n_1$, in which the first layer includes semiconductor nanocrystals, including at least the following steps:

calculation of the total number of layers of the stack, of the thicknesses of each of the layers of the stack and of the values of complex refraction indices $n_1$ and $n_2$ on the basis of the characteristics of a desired spectral reflectivity window of the optical reflector, including the use of an optical transfer matrices calculation method;

calculation of deposition and annealing parameters of the layers of the stack on the basis of the total number of layers of the stack, of the thicknesses of the layers of the stack and of the values of previously calculated complex refraction indices $n_1$ and $n_2$;

deposition and annealing of the layers of the stack in accordance with the previously calculated parameters.

Such an optical reflector includes at least two separate layers positioned one above the other, of different complex refraction indices, and the thicknesses of which are suitable for the manufacture of an optical reflector, for example of the RBD type.

At least one of the two layers includes semiconductor nanocrystals modifying complex reflection index $n_1$ of the first layer or layers of the optical reflector.

Thus, by modifying the number of layers forming the stack, the thicknesses of these layers and the complex refraction indices of these layers, it is possible to build an optical reflector the spectral reflectivity window of which is easily adjustable through the use of semiconductor nanocrystals which enable complex refraction index $n_1$ of the first layer or layers to be adjusted, notably by adjusting the density of semiconductor nanocrystals produced in the first layer or layers.

When the stack is positioned on a substrate comprising, for example, silicon, the optical reflector enables the wavelengths which will or will not be absorbed by the stack to be chosen, which enables light absorption to be heightened in the layers of the optical reflector, and the light absorption accomplished by the substrate to be minimised.

In addition, when the stack includes an upper stack (the layer positioned at the top of the stack) and a lower stack (the layer forming the base of the stack, on which the other layers of the stack rest) which are first layers including semiconductor nanocrystals, these upper and lower layers can be electrically conducting, bearing in mind the presence of semiconductor nanocrystals present in these layers, and can therefore be used as electrodes.

Such a method does not require the use of complex equipment, and can use standard equipment compatible with MOS technology.

The first and second layer may each be between approximately 10 nm and 500 nm thick, or between approximately 1 nm and several microns thick. The thickness of each of the layers may be equal to approximately $$\frac{\lambda}{4n},$$

where λ corresponds to the central wavelength of the desired spectral reflectivity window, and n corresponds to the refraction index (real part) of the material of the layer.

The semiconductor nanocrystals may comprise amorphous or crystalline silicon, and/or the first and/or the second layer may include silicon dioxide and/or silicon oxide and/or silicon nitride and/or silicon oxynitride and/or silicon carbide, or a compound comprising at least two of the previous elements. It is thus possible to manufacture an optical reflector comprised entirely of silicon-based materials, facilitating its manufacture when it is intended to be coupled with optoelectronic devices comprising silicon such as lasers, LEDs or any other optoelectronic device.

Such an optical reflector may advantageously include nanocrystals of amorphous or crystalline silicon arranged in a silicon-based matrix comprising, for example, $SiO_2$.

The second layer of complex refraction index $n_2$ may include semiconductor nanocrystals. It is possible for all the layers of the stack of the optical reflector to include semiconductor nanocrystals. It is thus possible to have an optical reflector the stack of layers of which is electrically conducting. In this case, the conductivity of the layers can easily be controlled by varying the number and density of semiconductor nanocrystals in the layers of the stack.

The stack may include m first layers of complex refraction index $n_1$ and m−1 second layers of complex refraction index $n_2$ positioned in alternating fashion one above the other, where m is an integer greater than or equal to 2.

The spectral reflectivity window of the manufactured optical reflector may be controlled by controlling the number of layers of the stack, the thicknesses of the layers and the optical indices of the layers. This is accomplished notably by controlling the density of semiconductor nanocrystals formed in the first layer or layers.

The calculation of the deposition and annealing parameters of the layers of the stack may be made, for each layer, on the basis of the values of the complex refraction indices and of the thicknesses of the layers obtained according to the different deposition and annealing parameters. The deposition parameters may correspond to a pressure at which the depositions of layers are made, and/or a gaseous flow rate of $SiH_4$ and/or a ratio of gaseous flow rates of $N_2O$ and of $SiH_4$ during depositions of the layers, and/or a duration of depositions and/or the power of the deposition equipment used, or several of the previous parameters.

During deposition of the layers of the stack, the first layer or layers of the stack may be produced such that they have a surplus of the semiconductor intended to form the nanocrystals, where the annealing may be accomplished subsequently to the depositions, and may form, in the first layer or layers, the semiconductor nanocrystals by precipitation in the solid state of the semiconductor of which there is a surplus in the first layer or layers deposited before the annealing.

It is therefore possible to control the number of nanocrystals in the first layer or layers by controlling the enrichment or surplus of semiconductor in the first deposited layers, and by controlling the annealing conditions. It is thus easy to control the optical indices (real and imaginary parts of the complex refraction indices) by varying the annealing conditions, but also the quantity of surplus semiconductor during deposition of the layers. A single annealing step may be applied to form the nanocrystals in all the first layers. It is also possible to accomplish an annealing between each deposition of a first layer.

The optical transfer matrices calculation method may include the following steps:

a) choice of arbitrary values of the total number of layers of the stack, of the thicknesses of each of the layers of the stack and of the values of complex refraction indices $n_1$ and $n_2$, b) calculation, for each layer of the stack and for each wavelength of the desired spectral reflectivity window, of an optical transfer matrix, c) calculation of a matrix product of the previously calculated optical transfer matrices for each of the layers in step b), corresponding to the optical transfer matrix of the stack of layers, d) calculation of the reflectivity of the stack for each wavelength of the desired spectral reflectivity window, e) comparison of the reflectivity calculated in step d) with the desired spectral reflectivity window, where steps b) to e) are repeated for different values of the total number of layers of the stack, of the thicknesses of each of the layers of the stack and of complex refraction indices $n_1$ and $n_2$ when the reflectivity calculated in step d) does not correspond to the desired spectral reflectivity window.

The deposition and annealing parameters of the layers of the stack may also be calculating on the basis of the values of the layers' attenuation coefficients.

Another embodiment of the invention also concerns a method of manufacturing a photovoltaic cell including the use of a method of manufacturing at least one first optical reflector as previously described, positioned in the front face of the photovoltaic cell, and forming an anti-reflective structure, and/or the use of a method of manufacturing at least one second optical reflector as previously described, positioned in the rear face of the photovoltaic cell, and forming a reflective structure.

BRIEF DESCRIPTION OF THE ILLUSTRATIONS

The present invention will be better understood on reading the description of example embodiments given purely as an indication and in no way restrictively, making reference to the appended illustrations in which.

Identical, similar or equivalent portions of the various figures described below have the same numerical references, to make it easier to move from one figure to another.

The various parts represented in the figures are not necessarily represented at a uniform scale, in order to make the figures more readable.

The various possibilities (variants and embodiments) must be understood as not being mutually exclusive, and being able to be combined with one another.

DETAILED ACCOUNT OF PARTICULAR EMBODIMENTS

Figure 1A:
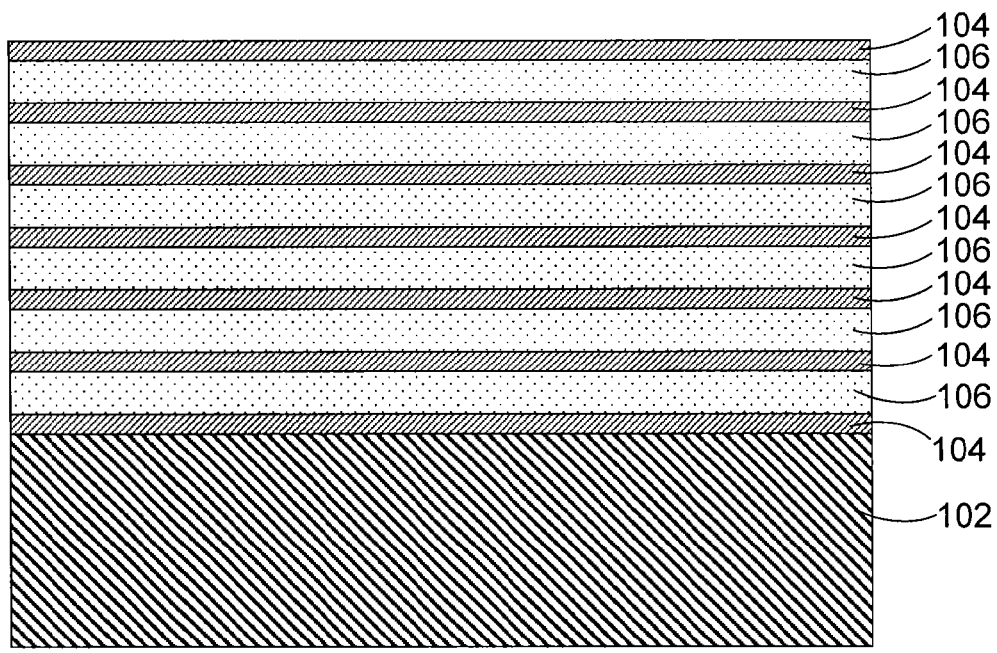
FIGS. 1A and 1B represent steps of a method to manufacture an optical reflector according to a particular embodiment.
Figure 1B:
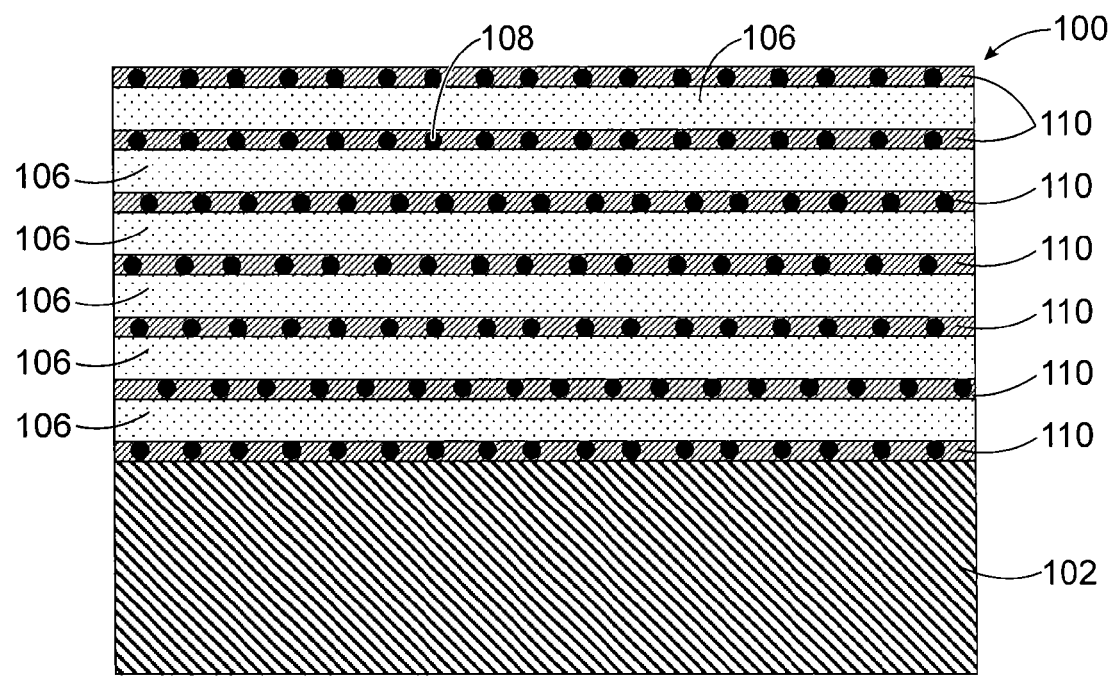

Reference is firstly made to FIGS. 1A and 1B, which represent steps of a method of manufacturing an optical reflector 100 according to a particular embodiment.

On a substrate 102, comprising for example silicon, an alternating stack of first layers 104 comprising silicon-rich silicon dioxide (or sub-stoichiometric $SiO_2$), and of second layers 106 comprising stoichiometric $SiO_2$, is produced. In the example of FIG. 1A the lower layer (the one in contact with the substrate 102 and on which the other layers of the stack are positioned) and the upper layer (the one positioned at the top of the stack) are first layers 104. The layers 104 and 106 of this stack are deposited for example by PECVD (Plasma Enhanced Chemical Vapour Deposition) with different thicknesses.

The thickness of each layer depends on the refraction index of the material or materials of the layer, and also of the wavelengths intended to be reflected. Generally, each layer 104, 106 may be between approximately 10 nm and 500 nm thick, or between approximately 1 nm and several microns thick, depending on the wavelengths of the desired spectral reflectivity window of the optical reflector 100. In a particular example, the thickness of each of the layers 104, 106 may be equal to approximately $$\frac{\lambda}{4n},$$

where $\lambda$ corresponds to the central wavelength of the desired spectral reflectivity window, and n corresponds to the refraction index (real part) of the material of the layer.

The stack produced in this manner is then subject to annealing at a temperature of, for example, lower than or equal to approximately 1300° C. for a duration of between approximately a few seconds and several hours (for example 3 hours). This annealing causes a densification of the layers 104 and 106 and, in the first layers 104, a separation of the stoichiometric $SiO_2$ and of the surplus silicon initially present in the first layers 104. This surplus silicon is precipitated in the solid state, forming nanocrystals 108 arranged in a dielectric matrix corresponding to the $SiO_2$ originating from the layers 104. By this means, the first layers 110 comprising $SiO_2$ and including silicon nanocrystals 108 is obtained.

In each of the first layers 110, the nanocrystals 108 may or may not have different dimensions. Thus, when each of the first layers 104 is less than approximately 8 nm thick, the silicon nanocrystals 108 obtained from these first layers 104 have roughly similar dimensions relative to one another. Conversely, when each of the first layers 104 is more than or equal to 8 nm thick, the silicon nanocrystals 108 may have different dimensions relative to one another. The nanocrystals 108 are each, for example, of a diameter of between approximately 1 nm and 20 nm. In the optical reflector 100, complex refraction indices $n_1$ of the first layers 110 are dependent, notably, on the density and distribution of the nanocrystals 108 in the first layers 110, and therefore also on the quantity of surplus silicon in the layers 104, on the annealing conditions and on the thickness of the layers 104 from which the first layers 110 are obtained.

The optical reflector 100 which forms a distributed Bragg reflector is obtained by this means, positioned on the substrate 102 and comprising an alternating stack of first layers 110 of complex refraction index $n_1$ and of second layers of complex refraction index $n_2$ different to complex refraction index $n_1$. In the obtained optical reflector 100, the second layers 106 form dielectric layers electrically insulating the first layers 110 which include the semiconductor nanocrystals 108, and which are therefore electrically conducting. The values of the real parts of complex refraction indices $n_1$ and $n_2$ may be, for example, between approximately 1.4 and 4.5 (at a wavelength equal to 632.8 nm).

The total number of layers 104 and 106, their thicknesses and optical indices, together with the materials used to manufacture the optical reflector 100, will depend on the spectral reflectivity window of the optical reflector 100 which it is sought to obtain.

Thus, in order to manufacture the optical reflector 100, the desired spectral reflectivity window is first characterised: a range of wavelengths which the optical reflector 100 is intended to reflect, and desired rate of reflectivity for this range of wavelengths. The considered wavelengths are, for example, of between approximately 300 nm and 1200 nm.

Figure 4:
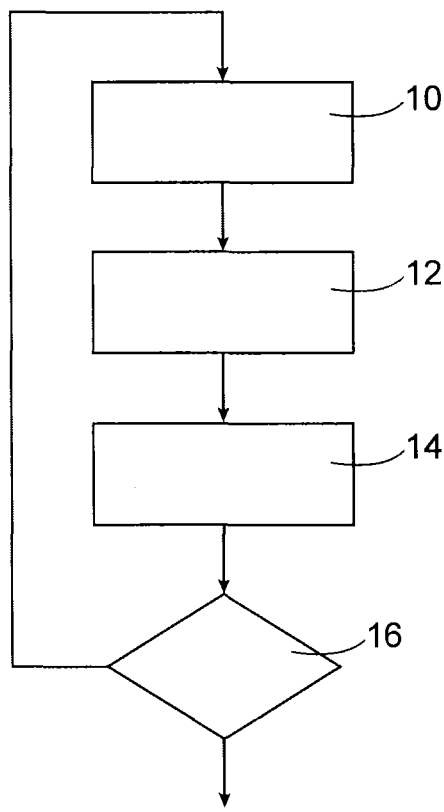
FIG. 4 represents the steps of a method of calculation of the optical transfer matrices used in a method of manufacturing an optical reflector.

The optical transfer matrices calculation method is then applied in order to determine the required number of layers 104 and 106, the thicknesses of these layers 104 and 106, and also the values of complex refraction indices $n_1$ and $n_2$ which each of these layers must have in order to obtain the optical reflector 100 having the desired spectral reflectivity window. An example of the use of the optical transfer matrices calculation method is described below in connection with the diagram represented in FIG. 4.

Arbitrary values of the parameters which it is desired to determine are firstly chosen, namely the number of layers 104 and 106, the thicknesses of these layers 104 and 106 and also complex refraction indices $n_1$ and $n_2$.

For each layer and for each wavelength $\lambda$ of the desired spectral reflectivity window, an optical transfer matrix M is then calculated (step 10) such that:

$$\begin{bmatrix} E(0) \\ H(0) \end{bmatrix} = M \begin{bmatrix} E(d) \\ H(d) \end{bmatrix},$$

where E and H correspond to the tangential components of the electrical and magnetic fields in the layer, d corresponds to the optical coordinates through the thickness of the layer.

Matrix M is equal to:

$$M = \begin{bmatrix} \cos\varphi & j\sin\varphi/Y \\ jY\sin\varphi & \cos\varphi \end{bmatrix}, \text{ where } \varphi = \frac{2\pi}{\lambda}nd\cos\Theta,$$

where $\varphi$ represents the phase-shifting of the light propagating through the layer, n corresponds to the complex refraction index of the layer, and $\Theta$ corresponds to the expected angle of incidence of the light relative to the layer (for example equal to 90°).

Y is the optical admittance of the layer which is equal, in the case of parallel (p or TE) and perpendicular (s or TM) polarisations, to:

$$Y^{(s)} = \sqrt{\frac{\varepsilon_0}{\mu_0}} n\cos\Theta$$

$$Y^{(p)} = \sqrt{\frac{\varepsilon_0}{\mu_0}} n/\cos\Theta$$

where $\varepsilon_0$ and $\mu_0$ are the permittivity and the permeability of a vacuum.

After that, the matrix of the complete system, i.e. of the stack of layers, is calculated (step 12), for each wavelength $\lambda$, corresponding to the matrix product of the matrices M of each layer.

From this optical transfer matrix of the complete system, it is then possible (step 14) to calculate, for each wavelength $\lambda$, the reflectivity r of the system such that:

$$r = \frac{Y_0 M_{11} + Y_0 Y_S M_{12} + M_{21} - Y_S M_{22}}{Y_0 M_{11} + Y_0 Y_S M_{12} + M_{21} + Y_S M_{22}}$$

Where $M_{ab}$ corresponds to the coefficient of line a and column b of the matrix M.

Reflectivity r obtained is compared to the desired spectral reflectivity window (step 16). If the obtained reflectivity r does not correspond to the desired spectral reflectivity window, the parameters which were initially chosen arbitrarily (thicknesses and/or optical indices and/or number of layers) are then modified, and the calculations are repeated until a system is obtained the calculated reflectivity of which corresponds to the desired spectral reflectivity window, meaning that the chosen parameters are correct.

From the previously calculated parameters, and from the values of the attenuation coefficients of the different layers (data which is known or calculated or measured, for example by spectroscopic ellipsometry), the parameters relating to the application of the deposits of these layers and the parameters of the annealing or annealings then accomplished are then determined. In this manner, in the case of layers comprising, for example, $SiO_2$ intended to be deposited by PECVD, the thickness of the layers to be produced will be dependent on the gaseous flow rates of $N_2O$ and $SiH_4$, on the pressure during deposition and on the power of the deposition equipment used, and also on the duration of application of the deposition. It should also be noted that the value of the complex refraction index of the layer obtained is principally (nearly 90%) dependent on the pressure and flow rate of $SiH_4$ during deposition.

Figure 5:
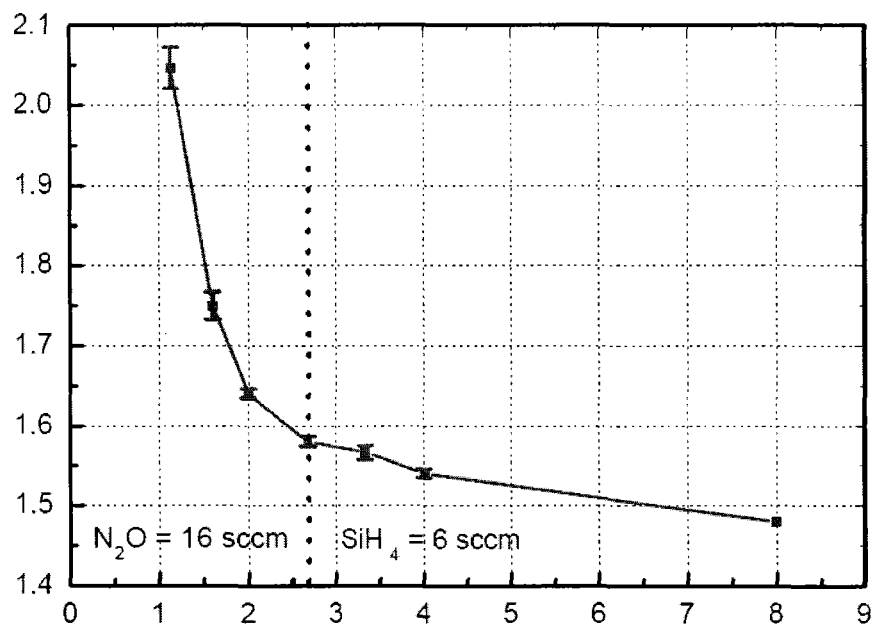
FIG. 5 represents a curve of variation of the refraction index of a layer deposited by PECVD as a function of a ratio of gaseous flow rates of $N_2O$ and of $SiH_4$ during the deposition of this layer.

It is, notably, possible to use to this end data (curves or tables of values), obtained experimentally or by simulation, giving the values of the refraction indices and of the thicknesses of the layers obtained as a function of these different deposition and annealing parameters. For example, FIG. 5 represents such a curve, giving the value of the refraction index (at a wavelength of 633 nm) of a layer of $SiO_2$ deposited by PECVD as a function of the ratio of gaseous flow rates of $N_2O$ and $SiH_4$ during deposition of this layer.

From the calculated deposition and annealing application parameters, it is therefore possible subsequently to implement the steps of deposition and annealing to produce the optical reflector 100, as described above in connection with FIGS. 1A and 1B.

Figure 2:
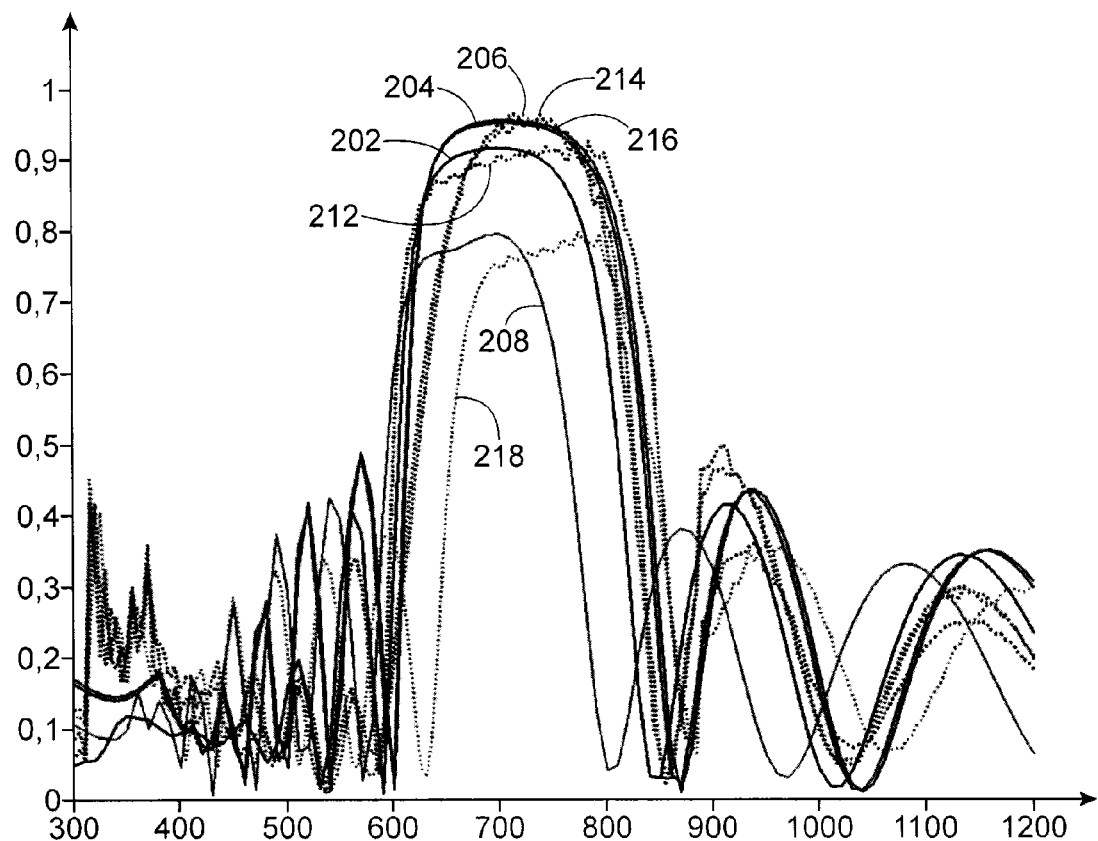
FIG. 2 represents measured and simulated spectral reflectivity windows of optical reflectors.

Curves 202, 204 and 206 represented in FIG. 2 are results of simulation of the reflectivity of the optical reflector 100 for different annealings.

For these simulations, the first layers 104 comprise silicon-rich $SiO_2$, and each is approximately 83.2 nm thick (except for the first layer 104 which is positioned against substrate 102, which is approximately 80 nm thick). The second layers 106 comprise stoichiometric $SiO_2$ and each is approximately 126 nm thick. The substrate 102 comprises silicon.

Curve 202 represents the case in which the layers 104 and 106 have been subjected to a single annealing at approximately 1000° C. for 3 min. The refraction index of a single one of the first layers 110 obtained including the silicon nanocrystals 108, at a wavelength of approximately 633 nm, is equal to approximately 2.01. Curve 204 represents the case in which the layers 104 and 106 have been subjected to a first annealing at approximately 1000° C. for 3 min., followed by a second annealing at approximately 1180° C. for 60 min. The refraction index of a single one of the first layers 110 obtained including the silicon nanocrystals 108, at a wavelength of approximately 633 nm, is equal to approximately 2.11.

Finally, curve 206 represents the case in which the layers 104 and 106 have been subjected to a single annealing at approximately 1180° C. for 60 min. The refraction index of a single one of layers 110 obtained including the nanocrystals 108, at a wavelength of approximately 633 nm, is equal to approximately 2.09.

By way of comparison, curve 208 corresponds to the reflectivity of an optical reflector including the same layers 104 and 106, but where these have not been subjected to annealing, and where this optical reflector therefore includes no silicon nanocrystals in its first layers. The refraction index of a single one of the layers 104 of silicon-enriched silicon dioxide, at a wavelength of approximately 633 nm, is equal to approximately 1.86.

By comparing curves 202, 204 and 206 with curve 208, it can clearly be seen that application of an annealing enables the spectral reflectivity window of an optical reflector to be broadened (increase of the range of wavelengths covered by this spectral reflectivity window), and also enables the value of the reflectivity of the optical reflector to be increased in the range of wavelengths of the spectral reflectivity window. This is due to the fact that annealing densifies the materials of the layers of the stack, and forms the semiconductor nanocrystals which increase the refraction index of the layers including these nanocrystals. It can also be seen from curves 202, 204 and 206 that an increase of the duration and temperature of the annealing broadens the spectral reflectivity window obtained, and increases the value of the reflectivity in this spectral window, due to the fact that the optical indices after the annealing are modified, notably due to the formation of the nanocrystals, which modifies the reflectivity properties.

Curves 212 to 218 represent measured spectral reflectivity windows of optical reflector 100 having been subjected to various annealings. These spectral reflectivity windows are measured, for example, by a spectrophotometer. Such a device sends an incident light beam, of known intensity and at different lengths of a desired spectrum, to the optical reflector, and measures the intensity of the reflected light at each of the different wavelengths, enabling the reflectivity of the optical reflector in the desired spectrum to be determined.

The first layers 104 comprise silicon-rich $SiO_2$, and each is approximately 62.5 nm thick (except for the first layer 104 which is positioned against substrate 102, which is approximately 58.1 nm thick).

Second layers 106 comprise stoichiometric $SiO_2$ and each is approximately 129.5 nm thick. The substrate 102 comprises silicon.

These curves do indeed confirm the enlargement of the spectral reflectivity window obtained, together with the increase of the value of reflectivity in the range of wavelengths of this spectral window, when the duration and/or temperature of the annealing is/are increased.

The spectral reflectivity window and the maximum band intensity of this reflectivity window of the optical reflector 100 therefore depend:
- on the total thickness of the optical reflector's stack of layers;
- on the thickness of each layer in the optical reflector's stack;
- on the number of layers in the optical reflector's stack;
- on the materials of the stack's layers, and notably on the one in which the semiconductor nanocrystals are positioned;
- on the semiconductor of the nanocrystals;
- on the density of the semiconductor nanocrystals in the first layers;

on the optical indices (real part of the complex refraction index, and imaginary part of the complex refraction index, called the attenuation coefficient) of the layers of the stack;

on the difference of the optical indices of the first and second layers of the stack.

In the previously described example, the semiconductor nanocrystals 108 are obtained by a precipitation of surplus semiconductor initially present in the deposited layers. As a variant, the semiconductor nanocrystals may be produced in situ, i.e. during the deposition of the layers and before the annealing or annealings, for example by CVD, LPCVD, evaporation, PECVD, sputtering, implantation, etc.

In this case it may be envisaged not to anneal the deposited layers.

First layers 110 including the semiconductor nanocrystals may comprise of at least one material other than silicon dioxide, such as silicon oxide, silicon nitride, silicon oxynitride, or again silicon carbide, deposited in the stoichiometric or sub-stoichiometric form, depending on whether the semiconductor nanocrystals are or are not produced in situ.

It is, further, possible to accomplish one or more annealings at different temperatures and/or in different atmospheres, either after all the layers of the stack have been deposited, or between these deposition steps.

The previously described optical reflector 100 includes alternating layers which comprise or not the nanocrystals 108. As a variant, it is possible for all the layers of the stack of the optical reflector 100 to include semiconductor nanocrystals. In this case the layers 104 and 106 should be produced from different materials in order that the optical reflector 100 which is ultimately obtained includes a stack formed from alternating layers of different complex refraction indices. The presence of semiconductor nanocrystals in all the layers of the optical reflector can give electrical conduction and/or luminescence and/or light absorption properties to the optical reflector. In the case of semiconductor nanocrystals arranged in dielectric layers, electrical conduction can notably be obtained when the distance between the nanocrystals is small enough to enable electrical conduction to be accomplished by tunnel effect through this dielectric material.

In another variant, it is possible that the differences of complex refraction indices within the stack of layers of the optical reflector are not obtained solely due to the fact that the layers 106 and 110 have different optical indices, but due to the fact that each of these layers has a variable optical index, for example in the form of a gradient, within the layer. Within such a layer the refraction index may vary according to the thickness of the layer:

changing in linear fashion from a first to a second refraction index value;

changing from a first to a second refraction index value over a first half of the thickness of the layer, and then changing from the second to the first refraction index value over the other half of the thickness of the layer;

oscillating, over the thickness of the layer, between two different refraction index values.

Such layers may be obtained by varying the composition of the material or materials used to form the layer (for example the silicon enrichment) over its thickness.

Figure 3:
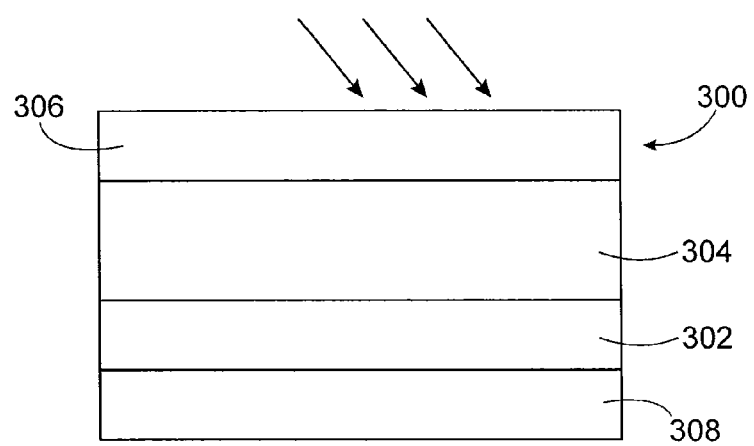
FIG. 3 represents a photovoltaic cell including optical reflectors.

FIG. 3 represents a photovoltaic cell 300 including a substrate 302, comprising for example p- or n-type silicon, and used as a mechanical support for the other elements of cell 300, and one or more active layers 304, comprising for example an n- or p-type semiconductor, able to convert photovoltaic energy. Reference 304 designates, for example, a stack of three layers comprising doped amorphous silicon such that they form a p-i-n stack (for example, a layer of intrinsic amorphous silicon positioned between a p doped layer and an n doped layer). The layer or layers 304 may also be produced from semiconductor nanocrystals, amorphous semiconductor, porous semiconductor, nanocrystalline semiconductor, polycrystalline semiconductor, etc. The active semiconductor of layer or layers 304 and substrate 302 form a p-n or n-p junction.

The photovoltaic cell 300 also includes in its front face (the face of the cell intended to receive the light rays) an optical reflector 306, for example similar to previously described optical reflector 100, forming a distributed Bragg reflector used as an anti-reflection covering for the cell 300. The optical reflector 306 is notably produced such that its spectral reflectivity window enables light reflection of the rays arriving on the front face of the photovoltaic cell 300 to be minimised, and absorption of the light rays by the active layers 304 to be maximised. The cell 300 also includes in its rear face a second optical reflector 308, also similar to the previously described optical reflector 100, and configured to reflect the incident light rays to the active layers 304 in order to maximise the photovoltaic conversion efficiency of the cell 300. The parameters of the optical reflectors 306 and 308 (number of layers, materials used, optical indices of the different layers) are chosen according to their roles.

The use of the optical reflectors 306 and 308 enables the photovoltaic cell 300 to be produced entirely from a single semiconductor, in this case silicon.

As a variant, it is possible that the photovoltaic cell 300 contains only a single one of the two optical reflectors 306 and 308.

The previously described different variants for the optical reflector 100 may be produced for one and/or other of the optical reflectors 306 and 308. As a variant, it is also possible that the front face of the photovoltaic cell 300 (and therefore the optical reflector 306) has a relief (or texturing) favouring light absorption in the cell 300. The photovoltaic cell 300 may be of the homojonction or heterojonction type.

The invention claimed is:

1. A method of manufacturing an optical reflector including at least one alternating stack of at least one first layer of complex refraction index $n_1$ and at least one second layer of complex refraction index $n_2$ that is different from complex refraction index $n_1$, in which the first layer includes semiconductor nanocrystals, the method comprising:

calculating a total number of layers of the stack, thicknesses of each of the layers of the stack, and values of complex refraction indices $n_1$ and $n_2$, based on characteristics of a desired spectral reflectivity window of the optical reflector, said calculating including an optical transfer matrices calculation method;

calculating deposition parameters and annealing parameters of the layers of the stack based on the total number of layers of the stack, on the thicknesses of the layers of the stack, and on the values of previously calculated complex refraction indices $n_1$ and $n_2$; and depositing and annealing the layers of the stack in accordance with said deposition parameters and annealing parameters wherein the deposition parameters correspond to a pressure at which the depositions of the layers are made, or a gaseous flow rate of $SiH_4$, or a ratio of gaseous flow rates of $N_2O$ and of $SiH_4$ during depositions of the layers, or a duration of depositions or the power of the deposition equipment used, or several of these parameters, and wherein the annealing parameters correspond to a temperature of the annealing and a duration of the annealing.

2. The method according to claim 1, in which the semiconductor nanocrystals comprise amorphous or crystalline silicon, or in which the first or the second layer includes silicon dioxide, or silicon oxide, or silicon nitride, or silicon oxynitride, or silicon carbide, or a compound comprising at least two of the previous elements.

3. The method according to claim 1, in which the second layer of complex refraction index $n_2$ includes semiconductor nanocrystals.

4. The method according to claim 1, in which the stack includes m first layers of complex refraction index $n_1$ and m-1 second layers of complex refraction index $n_2$ positioned in alternating fashion one above the other, where m is an integer greater than or equal to 2.

5. The method according to claim 1, wherein calculating the deposition and annealing parameters of the layers of the stack is made, for each layer, based on the values of the complex refraction indices and on the thicknesses of the layers obtained according to the different deposition and annealing parameters.

6. The method according to claim 1, in which, during deposition of the layers of the stack, the first layer or layers of the stack are produced such that they have a surplus of the semiconductor intended to form the nanocrystals, where the annealing is accomplished subsequently to the depositions and forms, in the first layer or layers, the semiconductor nanocrystals by precipitation in the solid state of the semiconductor of which there is a surplus in the first layer or layers deposited before the annealing.

7. The method according to claim 1, in which the optical transfer matrices calculation method further comprises:
   a) choosing arbitrary values of the total number of layers of the stack, the thicknesses of each of the layers of the stack and the values of complex refraction indices $n_1$ and $n_2$,
   b) calculating, for each layer of the stack and for each wavelength of the desired spectral reflectivity window, of an optical transfer matrix,
   c) calculating a matrix product of the previously calculated optical transfer matrices for each of the layers in step b), corresponding to the optical transfer matrix of the stack of layers,
   d) calculating the reflectivity of the stack for each wavelength of the desired spectral reflectivity window, and
   e) comparing the reflectivity calculated in step d) with the desired spectral reflectivity window,
   where steps b) to e) are repeated for different values of the total number of layers of the stack, of the thicknesses of each of the layers of the stack and of complex refraction indices $n_1$ and $n_2$ when the reflectivity calculated in step d) does not correspond to the desired spectral reflectivity window.

8. A method of manufacturing a photovoltaic cell including the method of manufacturing an optical reflector according to claim 1, positioned in the front face of the photovoltaic cell, and forming an anti-reflective structure.

9. A method of manufacturing a photovoltaic cell including the method of manufacturing an optical reflector according to claim 1, positioned in the rear face of the photovoltaic cell, and forming a reflective structure.

* * * * *